(12) United States Patent
Kasahara et al.

(10) Patent No.: US 6,603,319 B1
(45) Date of Patent: Aug. 5, 2003

(54) WATER IMMERSION DETECTING CIRCUIT

(75) Inventors: Mamoru Kasahara, Tokyo (JP); Shigeo Nomura, Tokyo (JP); Ichiro Kondo, Tokyo (JP); Kouji Yamaoka, Wako (JP); Seijiyu Kawamata, Wako (JP)

(73) Assignees: Oki Electric Industries Co., Ltd., Tokyo (JP); Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/594,605

(22) Filed: Jun. 15, 2000

Related U.S. Application Data (60) Provisional application No. 60/139,276, filed on Jun. 15, 1999.

(30) Foreign Application Priority Data

Jun. 16, 1998 (JP) .......................................... 10 168153

(51) Int. Cl.$^7$ ............................................... G01R 27/08
(52) U.S. Cl. ..................... 324/696; 324/694; 324/691
(58) Field of Search ................................ 324/696, 664, 324/689, 690, 694, 691, 695; 73/304 C

(56) References Cited

U.S. PATENT DOCUMENTS

| | | | | | |
|---|---|---|---|---|---|
| 3,862,571 | A | * | 1/1975 | Vogel .................... | 324/679 X |
| 4,433,577 | A | * | 2/1984 | Khurgin et al. .......... | 73/290 V |
| 5,365,783 | A | * | 11/1994 | Zweifel .................. | 324/662 X |
| 5,722,290 | A | * | 3/1998 | Kronberg ................ | 324/664 X |
| 5,736,865 | A | * | 4/1998 | Nelson et al. ............ | 324/660 |
| 5,802,728 | A | * | 9/1998 | Karnick et al. ........... | 33/366 |
| 6,240,778 | B1 | * | 6/2001 | Hannan et al. .......... | 324/664 X |

* cited by examiner

*Primary Examiner*—N. Le
*Assistant Examiner*—T. R. Sundaram
(74) *Attorney, Agent, or Firm*—Liniak, Berenato, Longacre & White

(57) ABSTRACT

The object of the invention is to provide a water immersion detecting circuit, which is free from false detection and is stable and highly sensitive in operation. There is provide a water immersion detecting circuit provided on a printed board 11 of an electronic unit and used for detecting water immersion of the electronic unit based on a change of resistance generated between a pair of sensor electrodes for detecting water immersion P10, p11, wherein the pair of sensor electrodes P10, P11 are positioned opposite to each other on the printed board 11, and a U-shaped slit (opening) 12 is formed between the sensor electrodes P10, P11.

6 Claims, 7 Drawing Sheets

WATER IMMERSION DETECTING CIRCUIT

This application claims benefit of provisional application, Ser. No. 60/139,276 filed Jun. 15, 1999.

BACKGROUND OF THE INVENTION

1. Field of the Invention

The present invention relates to a water immersion detecting circuit which is provided on a printed board of an electronic unit and is used for detecting water immersion of the electronic unit based on a change of resistance generated between a pair of sensor electrodes for detecting water immersion. More particularly, the present invention relates to a water immersion detecting circuit which is characterized by arrangements of the sensor electrodes, and which is highly resistant to malfunction due to dampness and dew condensation, and further which actuates accurately when the electronic unit is immersed in water.

2. Prior Art

Figure 9:
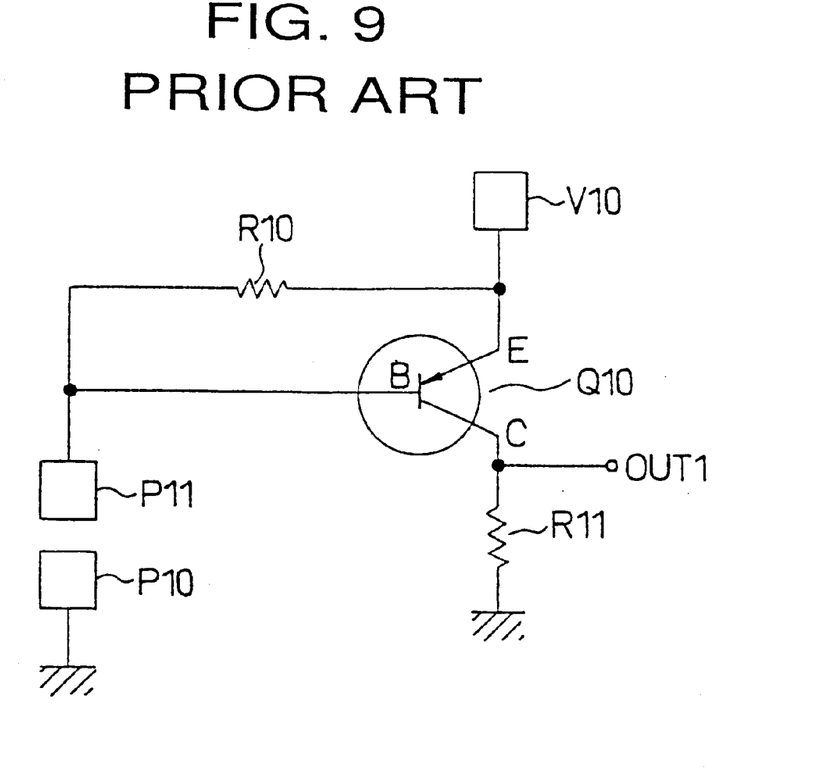
FIG. 9 is a circuit diagram of the conventional water immersion detecting circuit.

In a related prior art technology, the following circuit is typically used. FIG. 9 is a circuit diagram of the conventional water immersion detecting circuit, in which P10 and P11 designate sensor electrode pads for detecting water immersion, Q10 designates an output transistor for detecting water immersion, R10 designates a resistor for regulating the detection sensitivity, R11 designates an output resistor for detecting water immersion, V10 designates a power supply, and OUT1 designates an output terminal for detecting water immersion. The water immersion detecting circuit shown in FIG. 9 is mounted on a printed board of an electronic unit (not shown). The water immersion detecting circuit is water-proof except for the sensor electrode pads P10, P11.

Figure 10:
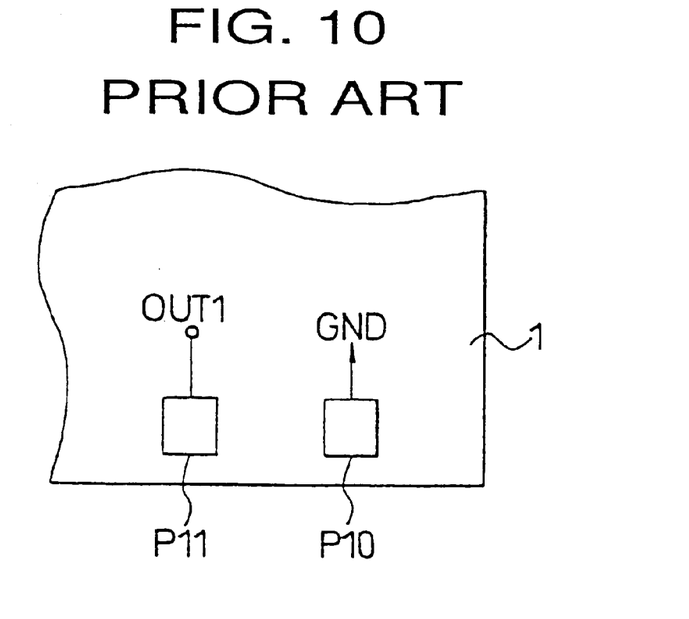
FIG. 10 shows the structure of a pair of sensor electrodes for detecting water immersion provided in the water immersion detecting circuit shown in FIG. 9.

FIG. 10 shows the structure of the sensor electrodes for detecting water immersion provided in the water immersion detecting circuit of FIG. 9. The sensor electrode pads P10, P11 are placed in the same plane of the printed board 1 provided in the electronic unit in such a way that they are positioned adjacently and oppositely to each other. The sensor electrode pad P10 is connected to the ground.

As mentioned above, in the conventional sensor electrodes for detecting water immersion, two sensor electrode pads P10, P11 are adjacently and oppositely positioned in the same plane of the printed board 1, and when the electronic unit is immersed in water, the opposed sensor electrode pads P10, P11 are electrically connected and the circuit becomes continuous. The continuity of the circuit is detected and current flowing in the circuit is amplified such that the increased current is obtained for detecting water immersion.

Referring to FIGS. 9 and 10, operation of the water immersion detecting circuit will be described.

Generally, river water, sea water and the like water is conductive. When the electronic unit incorporating the water immersion detecting circuit shown in FIG. 9 falls into water such as river water or sea water, a leakage current flows between the sensor electrode pads P10, P11 since the sensor electrode pads P10, P11 are electrically connected through the conductive water and the circuit is made. In this case, the current strength depends on the conductivity of the immersed water, shape of the sensor electrode pads P10, P11, distance between the opposite sensor electrodes, voltage of the power supply and the like. Leakage current flows from the power supply V10 through the resistor R10 when the current value is smaller. However, when the current value is greater than a certain amount, the transistor Q10 is biased and the emitter and the collector of the transistor Q10 are placed in On-state, thereby yielding output for detecting water immersion at the output terminal OUT1 of the resistor R11.

The resistor R10 shown in FIG. 9 is for defining leakage current which urges the transistor Q10. The resistor 10 prevents false detection due to fine leakage current resulting from dampness, dew condensation, noise or the like. The resistor 10 also ensures stable operation of the circuit as well as determines the detection sensitivity of the circuit. The transistor Q10 is not biased unless leakage current flows through the resistor R10 and the potential difference at both ends of the resistor R10 reaches to a certain value for connecting the emitter and the collector of the transistor Q10.

SUMMARY OF THE INVENTION

However, in the conventional water immersion detecting circuit, since the sensor electrode pads are mounted on the printed board in such a way that they are adjacent and opposite to each other, false detection would be made when dew covers the electronic unit. This is because when the sensor electrode pads are covered with waterdrops, a leakage current flows between the sensor electrode pads and water immersion is detected.

In order to prevent such false detection and provide a water immersion detecting circuit with suitable sensitivity, highly educated technology and experience are required so as to modify the shape of the sensor electrode pads, structural design of the circuit including a space between the sensor electrode pads, and the amplification degree of the transistor as well as to calculate base resistance and sensitizing current in the circuit.

In view of the above, the present invention seeks to provide a water immersion detecting circuit, which is free from false detection by dew condensation or the like, and is stable and highly sensitive in operation.

According to the present invention, there is provided (1) a water immersion detecting circuit provided on a printed board of an electronic unit and used for detecting water immersion of the electronic unit based on a change of resistance generated between a pair of sensor electrodes for detecting water immersion, wherein the pair of sensor electrodes are positioned opposite to each other on the printed board, and an opening is formed between the sensor electrodes.

There is also provided (2) a water immersion detecting circuit according to the circuit (1), wherein the opening is a U-shaped slit.

There is also provided (3) a water immersion detecting circuit according to the circuit (1), wherein the opening is a V-shaped slit.

There is also provided (4) a water immersion detecting circuit according to the circuit (1), wherein the opening is a hole.

Another object of the present invention is to provide (5) a water immersion detecting circuit provided on a printed board of an electronic unit and used for detecting water immersion of the electronic unit based on a change of resistance generated between a pair of sensor electrodes for detecting water immersion, wherein each of the sensor electrodes is positioned on both front and reverse sides of the printed board respectively.

Further object of the present invention is to provide (6) a water immersion detecting circuit provided on a printed board of an electronic unit and used for detecting water immersion of the electronic unit, wherein a single sensor electrode for detecting water immersion is provided on the printed board of the electronic unit, and water immersion of the electronic unit is detected based on a change of resistance between the sensor electrode and the grounding point of the electronic unit.

Other objects and features of the present invention will become apparent by reference to the following detailed description taken in conjunction with the accompanying drawings.

BRIEF DESCRIPTION OF THE DRAWINGS

FIG. 8 is a view explaining the mounting of the driving circuit own in FIG. 6, in which

DESCRIPTION OF THE PREFERRED EMBODIMENT

Figure 1:
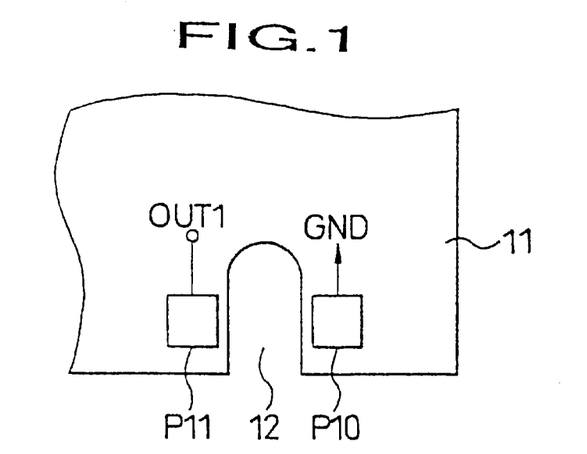
FIG. 1 shows the structure of a pair of sensor electrodes for detecting water immersion provided in a water immersion detecting circuit of an electronic unit according to a first embodiment of the present invention.

Referring now to FIG. 1, there is shown a water immersion detecting circuit according to a first embodiment of the invention. The water immersion detecting circuit is substantially the same as the circuit shown in FIG. 9.

In this water immersion detecting circuit, a pair of sensor electrode pads for detecting water immersion P10, P11 are mounted on a printed board 11 of an electronic unit in such a way that they are positioned opposite to each other. A U-shaped slit or gap 12 is provided between the sensor electrode pads P10, P11 so that an opening is made on the printed board 11. It is noted that, for purposes of this application, the terms slit and gap are used interchangeably and are intended to describe the arrangement shown in the relevant figures as a subcategory of the generic term opening.

According to this embodiment, there is provided a U-shaped slit 12 between the sensor electrode pads P10, P11 of the water immersion detecting circuit. With the provision of the U-shaped slit 12, false detection of the water immersion detecting circuit is prevented even if the ambient atmosphere is humid and dew condensation is made. Since the opening is made between the sensor electrode pads P10, P11, waterdrops formed by dew condensation do not bridge the space between the sensor electrode pads P10, p11, thereby eliminating the false detection in the conventional water immersion detecting circuit.

Further, the water immersion detecting circuit can easily be made by partly modifying the conventional circuit, i.e., by merely providing the U-shaped slit 12 on the conventional printed board. According to the first embodiment of the invention, a water immersion detecting circuit which is stable and highly sensitive in operation can be provided in a very simple fashion.

Figure 2:
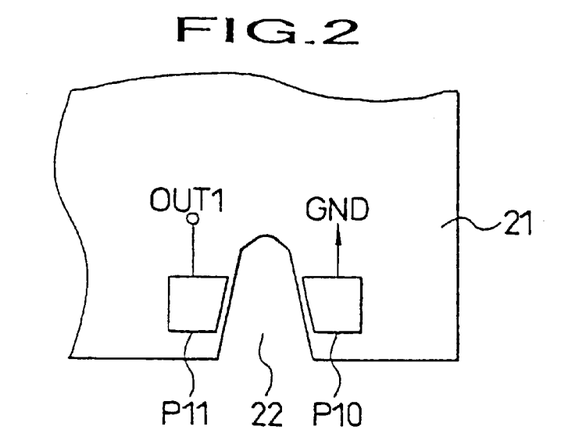
FIG. 2 shows the structure of a pair of sensor electrodes for detecting water immersion provided in a water immersion detecting circuit of an electronic unit according to a second embodiment of the present invention.

Referring to FIG. 2, there is shown a water immersion detecting circuit according to a second embodiment of the invention. As shown in FIG. 2, sensor electrode pads for detecting water immersion P10, P11 are mounted on a printed board 21 of an electronic unit in such a way that they are positioned opposite to each other. A V-shaped slit 22 is provided between the sensor electrode pads P10, P11 so that an opening is made on the printed board 11.

According to this embodiment, there is provided a V-shaped slit or slot 22 between the sensor electrode pads P10, P11 of the water immersion detecting circuit. With the provision of the V-shaped slit 12, false detection of the water immersion detecting circuit is prevented even if the ambient atmosphere is humid and dew condensation is made. Since the opening is made between the sensor electrode pads P10, P11, waterdrops formed by dew condensation do not bridge the space between the sensor electrode pads P10, p11, thereby eliminating the false detection in the conventional water immersion detecting circuit.

Further, provision of the V-shaped slit 22 ensures quick and reliable waterdrop-removing performance between the sensor electrode pads P10, P11 from the widely cut area of the V-shaped slit 22. Therefore, when unintentionally spilt water covers the printed board 21, all the waterdrops bridging the space between the sensor electrode pads P10, P11 are removed quickly so as to recover the function of the water immersion detecting circuit.

Figure 3:
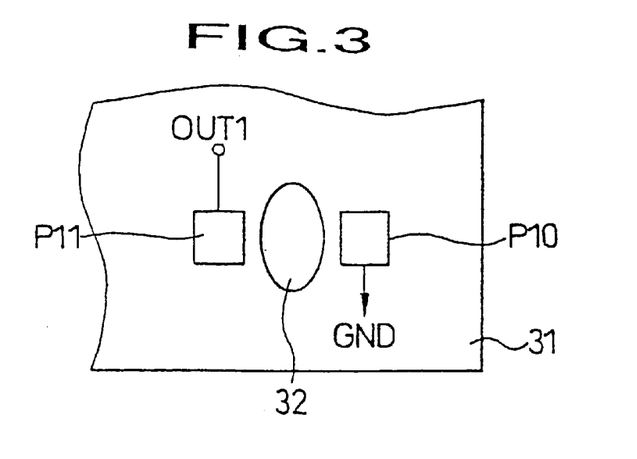
FIG. 3 shows the structure of a pair of sensor electrodes for detecting water immersion provided in a water immersion detecting circuit of an electronic unit according to a third embodiment of t present invention.

Referring to FIG. 3, there is shown a water immersion detecting circuit according to a third embodiment of the invention. As shown in FIG. 3, sensor electrode pads for detecting water immersion P10, P11 are mounted on a printed board 31 of an electronic unit in such a way that they are positioned opposite to each other. A hole 32 is provided between the sensor electrode pads P10, P11 so that an opening is made on the printed board 11.

According to this embodiment, there is provided a hole 32 between the sensor electrode pads P10, P11 of the water immersion detecting circuit. With the provision of the hole 32, false detection of the water immersion detecting circuit is prevented even if the ambient atmosphere is humid and dew condensation is made. Since the opening is made between the sensor electrode pads P10, P11, waterdrops formed by dew condensation do not bridge the space between the sensor electrode pads P10, p11, thereby eliminating the false detection in the conventional water immersion detecting circuit.

According to this embodiment, since the hole 32 is provided between the sensor electrode pads P10, P11, false detection of the water immersion detecting circuit can be eliminated irrespective of the arrangement of the sensor electrode pads P10, p11.

In the above first to third embodiments, pads are employed as sensor electrodes for detecting water immersion. However, as long as being conductive, other parts such as metallic pattern and lead wire may be employed.

Figure 4:
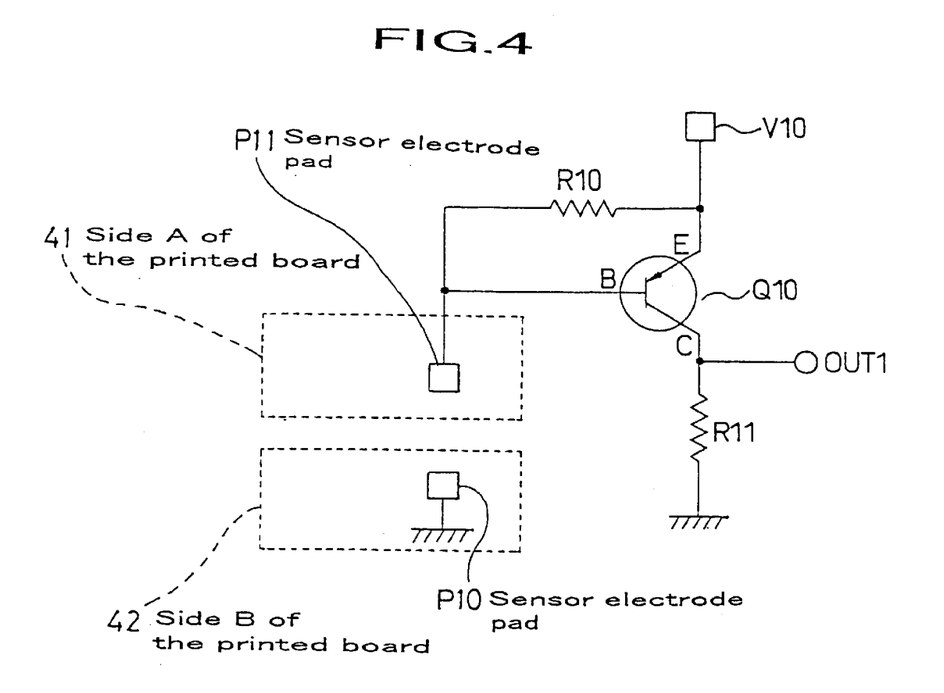
FIG. 4 is a circuit diagram of a water immersion detecting circuit according to a fourth embodiment of the present invention.

Referring now to FIG. 4, there is shown a water immersion detecting circuit according to a fourth embodiment of the invention. The water immersion detecting circuit shown in FIG. 4 is substantially the same as the circuit shown in FIG. 9 except that a pair of sensor electrode pads P10, p11 are mounted on a printed board in such a way that one sensor electrode pad is positioned on the front side of the printed board, while the other electrode pad is positioned in the reverse side. As shown in FIG. 4, the sensor electrode pad P11 is positioned in the parts-mounting side (Side A) 41 of the printed board, and the sensor electrode pad P10 is positioned in the reverse side (Side B) 42 of the printed board.

Operation of the water immersion detecting circuit shown in FIG. 4 will be described. When the electronic unit incorporating the printed board falls into water such as river water or sea water, the sensor electrode pads P10, P11 respectively mounted on the front or the reverse side 41, 42 are electrically connected through the surrounding conductive water. As is similar to the water immersion detecting circuit shown in FIG. 9, when the sensor electrode pads P10, P11 are immersed into water, the circuit becomes continuous and leakage current flows. When the current value of the leakage current reaches to a certain amount, the transistor Q10 is biased so that the emitter and the collector of the transistor Q10 are placed in On-state, thereby yielding output for detecting water immersion at the output terminal OUT1 of the resistor R11.

According to the fourth embodiment, since each of the sensor electrode pads for detecting water immersion P10, P11 are mounted on the front and the reverse sides 41, 42, respectively, a leakage circuit is not made on the printed board and no leakage current flows between the sensor electrode pads P10, p11 when the ambient atmosphere is humid and dew condensation is made. The water immersion detecting circuit is simple in its construction and is free from false detection even if the detection sensitivity of the circuit is improved. In this embodiment, there is provided a stable and highly sensitive water immersion detecting circuit, which actuates accurately when immersed into water.

In the above fourth embodiment, pads are employed as sensor electrodes for detecting water immersion. However, as long as being conductive, other parts such as metallic pattern and lead wire may be employed. Further, as long as a change of the resistance between the sensor electrode pads can be detected, arrangement of the water immersion detecting circuit is not restricted to that shown in FIG. 4.

Figure 5:
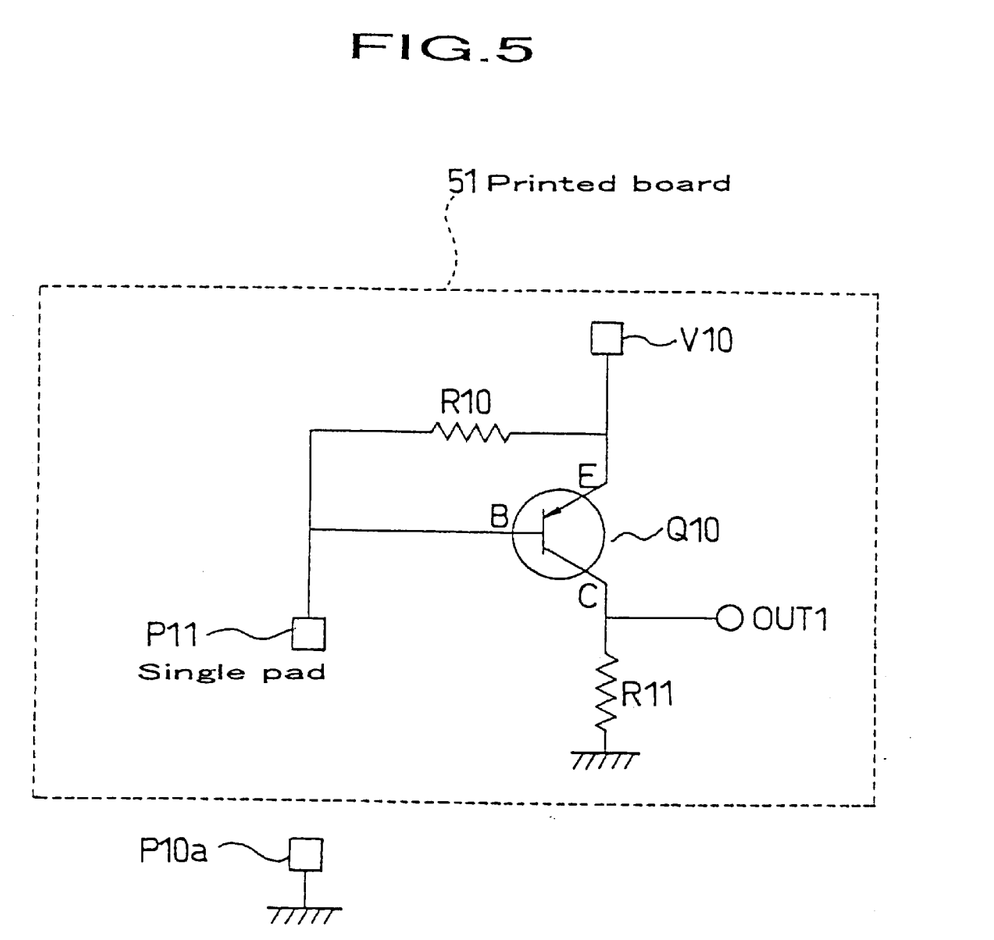
FIG. 5 is a circuit diagram of a water immersion detecting circuit according to a fifth embodiment of the present invention.

Referring to FIG. 5, a water immersion detecting circuit according to a fifth embodiment of the invention will be described. The water immersion detecting circuit shown in FIG. 5 is substantially the same as the circuit shown in FIG. 9 except that one sensor electrode pad (ground electrode pad) P10 is removed from the printed board 51 and a single electrode pad p11 is mounted on the printed board 51. In this embodiment, a grounding point P10a of the electronic unit, such as the ground of the frame or the housing where the electronic unit is mounted is regarded as the sensor electrode pad P10 shown in FIG. 9.

Operation of the water immersion detecting circuit shown in FIG. 5 will be described. When the electronic unit incorporating the printed board falls into water such as river water or sea water, the single electrode pad for detecting water immersion (herein after referred to as "single pad") P11 mounted on the printed board is electrically connected to the grounding point P10a through the surrounding conductive water. When the single pad P11 is immersed into water, the circuit is made and leakage current flows. When the current value of the leakage current reaches to a certain amount, the transistor Q10 is biased so that the emitter and the collector of the transistor Q10 are placed in On-state, thereby yielding output for detecting water immersion at the output terminal OUT1 of the resistor R11.

According to the fifth embodiment, since a single pad is employed in stead of a pair of sensor electrode pads for detecting water immersion, a leakage circuit is not made on the printed board and no leakage current flows when the ambient atmosphere is humid and dew condensation is made. The water immersion detecting circuit is simple in its construction and is free from false detection even if the detection sensitivity of the circuit is improved. In this embodiment, there is provided a stable and highly sensitive water immersion detecting circuit, which actuates accurately when immersed into water.

In the above fifth embodiment, a pad is employed as a single pad. However, as long as being conductive, other parts such as metallic pattern and lead wire may be employed. Further, as long as a change of the resistance between the single pad and the grounding point of the electronic unit can be detected, arrangement of the water immersion detecting circuit is not restricted to that shown in FIG. 5.

Obviously many modifications and variations of the present invention are possible in the light of the above teachings. It is therefore to be understood that within the scope of the appended claims the invention may be practiced otherwise than as specifically described.

EXAMPLE OF THE PREFERRED EMBODIMENT

Figure 6:
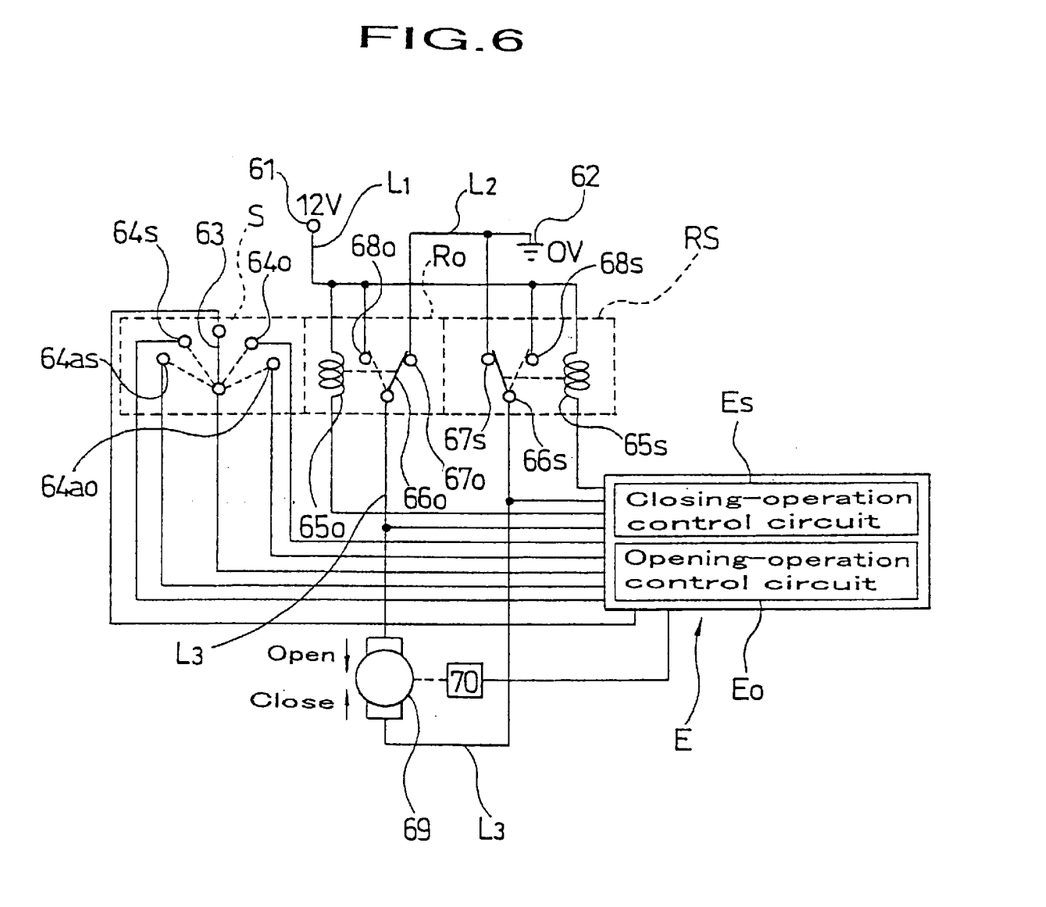
FIG. 6 shows a driving circuit for an automotive power window incorporating a water immersion detecting circuit according to the present invention.
Figure 7:
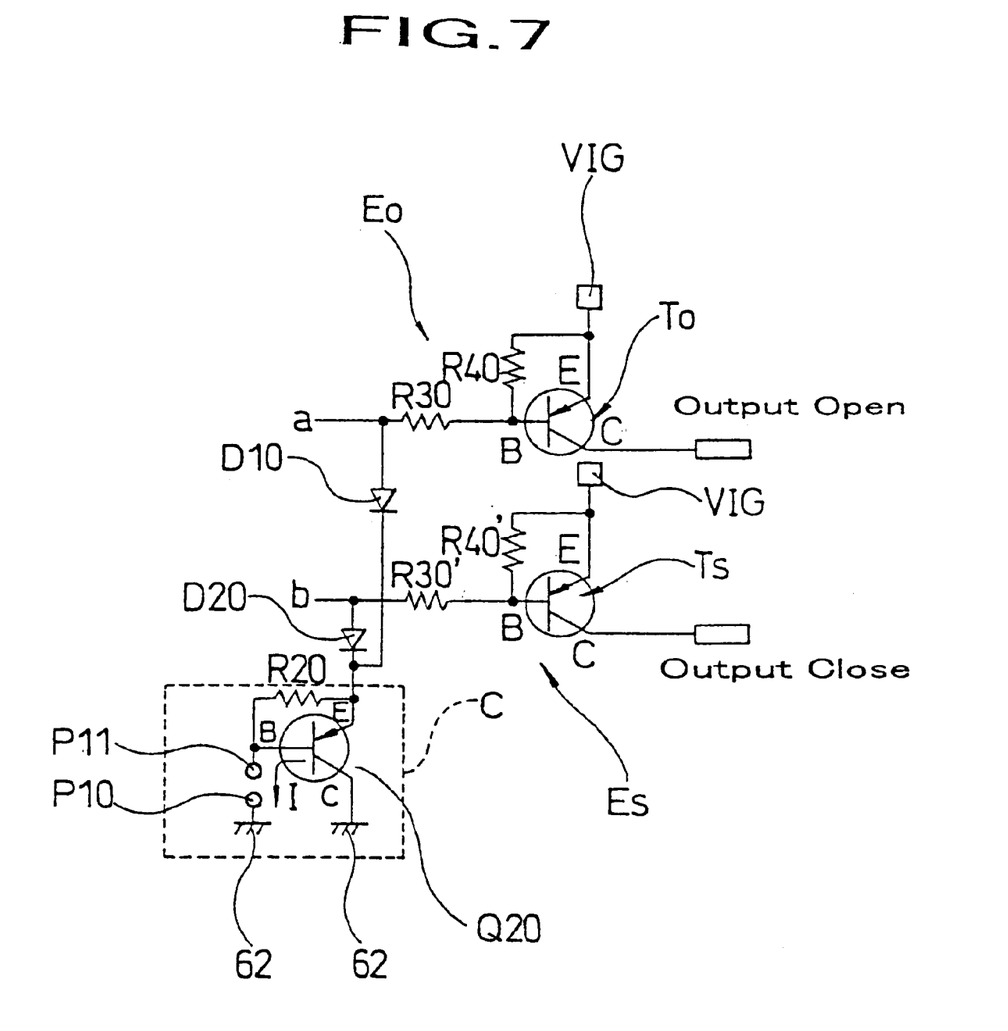
FIG. 7 is a circuit diagram of the driving circuit shown in FIG. 6.

With reference to FIGS. 6 to 8, an example of a water immersion detecting circuit according to the invention will be described, in which the circuit is incorporated into an electronic circuit for driving an automotive power window. The water immersion detecting circuit incorporated into the electronic circuit may be of any type disclosed as the first to fifth embodiments of the invention or any other type defined within the scope of the present invention.

In this example, a water immersion detecting circuit according to the present invention is incorporated into the electronic unit so as to prevent false detection of the electronic circuit (electronic unit) when immersed into water as well as to prevent the automotive window from being unintentionally open or closed.

Referring now to FIG. 6, the driving circuit of the automotive power window will be described. The driving circuit includes a first line L1 connected to a power source 61 such as a 12-volt onboard battery (not shown), a second line L2 connected to a ground 62, which is held at 0 volts, a manipulation switch S operable by a driver, an opening relay Ro which is closed for opening the automotive window, and a shutting relay Rs which is closed for shutting the automotive window. The manipulation switch S, opening relay Ro and the shutting relay Rs are connected between the first line L1 and the second line L2. The manipulation switch S is provided with a contact 63 normally urged to a neutral position by way of a spring (not shown). When the driver manipulates the switch S, the contact 63 is connected to an opening terminal 64o, shutting terminal 64s, automatic opening terminal 64ao or an automatic shutting terminal 64as.

The electronic circuit E controls opening and shutting movements of the opening relay Ro and the shutting relay Rs according to the above five positions of the manipulation switch S. When the manipulation switch S is turned to "Open" position at which the contact 63 is connected to the opening terminal 64o, a coil 65o in the opening relay Ro is excited, thereby connecting a contact 66o away from an OFF terminal 67o to an ON terminal 68o. As a result, the circuit is made between the power source 61, first line L1, ON terminal 68o and the contact 66o in the opening relay Ro, third line L3, motor 69, third line L3, contact 66s and the OFF terminal 67s in the shutting relay Rs, second line L2, and the ground 62. The motor 69 is then driven to the retracting direction so as to open the automotive window.

When the manipulation switch S is turned to "Close" position at which the contact 63 is connected to the shutting terminal 64s, a coil 65s in the shutting relay Rs is excited, thereby connecting a contact 66s away from an OFF terminal 67s to an ON terminal 68s. As a result, the circuit is made between the power source 61, first line L1, ON terminal 68s and the contact 66s in the shutting relay Rs, third line L3, motor 69, third line L3, contact 66o and the OFF terminal 67o in the opening relay Ro, second line L2, and the ground 62. The motor 69 is then driven to the extending direction so as to shut the automotive window.

When the manipulation switch S is turned to "Automatic Open" or "Automatic Close" position at which the contact 63 is connected to the automatic opening terminal 64ao or the automatic shutting terminal 64as, the coil 65o in the opening relay Ro or the coil 65s in the shutting relay Rs is excited by the electronic circuit E, thereby driving the motor 69 to the retracting or extending direction. Once the motor 69 is actuated, the electronic circuit E keeps the motor 69 running, even if the switch S is returned to the neutral position. The electronic circuit E receives an input signal from a rotating pulser 70 mechanically connected to the rotational axis of the motor 69. When the electronic circuit E detects the automotive window in the fully extended position or the fully retracted position, the coil 65o in the opening relay Ro or the coil 65s in the shutting relay Rs is demagnetized so as to turn off the motor 69.

Load of the motor 69 will be increased if an obstacle is captured between the window frame and the automotive window during the shutting operation of the window. When the electronic circuit E detects an obstacle by a change of current from the motor 69, the shutting relay Rs is broken for a certain period of time and the opening relay Ro is made. Therefore, the automotive window is slightly moved to the retracting direction so as to prevent the obstacle from being captured.

There is a possibility that the automotive window is unintentionally open when the electronic circuit E is immersed into water. This is because the coil 65o in the opening relay Ro is excited by leakage current and the opening relay Ro is made. On the contrary, there is also a possibility that the automotive window is unintentionally closed when the coil 65s in the shutting relay Rs is excited by leakage current and the shutting relay Rs is made. In order to facilitate such unintentional movement of the automotive window, a water immersion detecting circuit C is incorporated into the electronic circuit E.

Referring to FIGS. 6 to 8, the electronic circuit E will be described. The electronic circuit E comprises an opening-operation control circuit Eo and a closing-operation control circuit Es. The opening-operation control circuit Eo and the closing-operation control circuit Es are respectively constructed from a multistage transistor circuit for exciting the coil 65o in the opening relay Ro or the coil 65s in the shutting relay Rs by way of the manipulating switch S. FIG. 7 shows a circuit diagram of the multistage transistor circuit, in which the water immersion detecting circuit C is connected to the transistor circuit at the final output stage in the opening-operation control circuit Eo and the closing-operation control circuit Es.

As shown in FIG. 7, at the final output stage, the transistor circuit in the opening-operation control circuit Eo and the transistor circuit in the closing-operation control circuit Es are identical, and they are respectively provided with a transistor for final output (hereinafter referred to as "final output stage transistor") To, Ts in the type of PNP transistor. When turning the manipulation switch S to "Open" position and a terminal a is electrically connected to the ground 62 through a former stage transistor circuit (not shown) with respect to the opening-operation control circuit Eo, bias voltage, dividing the supply voltage VIG at resistors R30, R40, is applied to the base of the final output stage transistor To, thereby turning on the transistor To. As a result, the coil 65o in the opening relay Ro is excited, and the opening relay Ro is made. Therefore, the motor 69 is actuated so as to retract the automotive window. Meanwhile, when turning the manipulation switch S to "Close" position and a terminal b is electrically connected to the ground 62 through a former stage transistor circuit (not shown) with respect to the closing-operation control circuit Es, bias voltage, dividing the supply voltage VIG at resistors R30', R40', is applied to the base of the final output stage transistor Ts, thereby turning on the transistor Ts. As a result, the coil 65s in the shutting relay Rs is excited, and the shutting relay Rs is made. Therefore, the motor 69 is actuated so as to extend the automotive window.

The water immersion detecting circuit C is provided with a PNP transistor Q20. The emitter of the transistor Q20 is connected to the terminals a, b in the opening-operation control circuit Eo and the closing-operation control circuit Es through diodes D10, D20. The collector of the transistor Q20 is connected to the ground 62. A resistor R20 is connected between the emitter and the base of the transistor Q20. The base of the transistor Q20 is connected to the sensor electrode pad P11, while the sensor electrode pad P10 is connected to the ground 62. Arrangement of the sensor electrode pads P10, P11 may be of any one type disclosed in the first to fifth embodiments of the inventive water immersion detecting circuit.

Figure 8A:
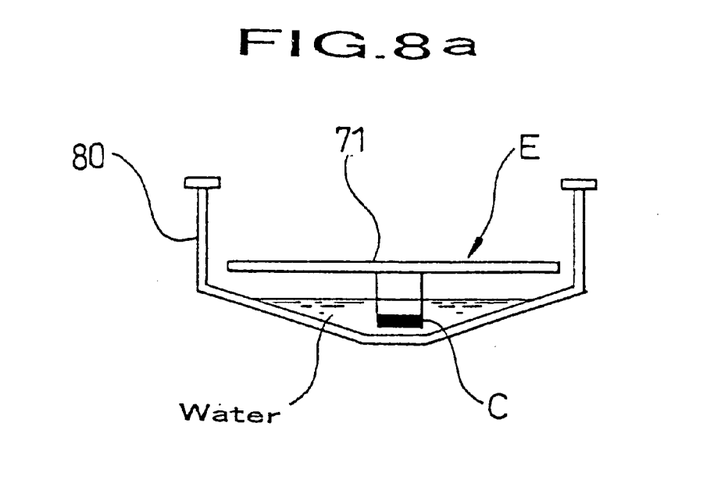
FIG. 8a shows the water immersion detecting circuit placed at the lowermost position within a casing.
Figure 8B:
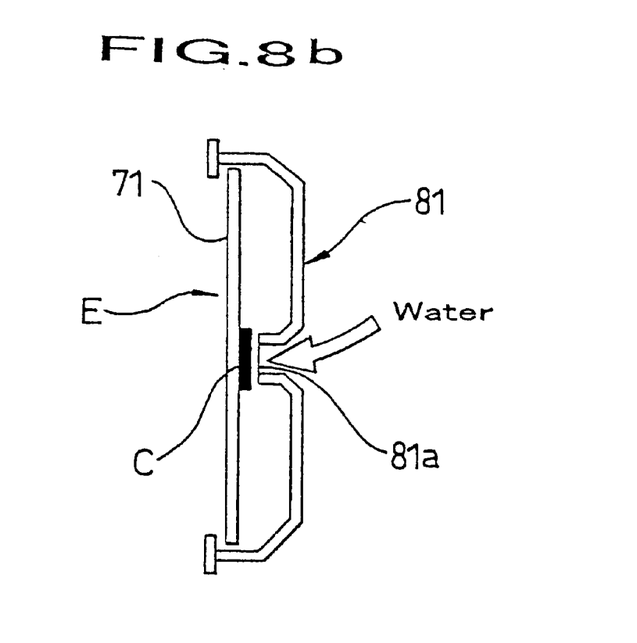
FIG. 8b shows the water immersion detecting circuit positioned opposite to an opening of a casing.

The water immersion detecting circuit C is placed in such a way that it can detect water immersion before the driving circuit of the automotive power window is unintentionally actuated. To this end, the water immersion detecting circuit C is positioned at a place where water firstly soaks compared to the opening-operation control circuit Eo and the closing-operation control circuit Es. As shown in FIG. 8a, the water immersion detecting circuit C may be placed at the lowermost position within a casing 80. Alternatively, as shown in FIG. 8b, the water immersion detecting circuit C may be positioned at a place where it is opposite to an opening 81a of a casing 81. The casings 80, 81 are for accommodating the printed board 71 of the electronic circuit E.

Operation of the water immersion detecting circuit C and the automotive power window at the time of water immersion will be described. When conductive water comes into the casing 80, 81, the water immersion detecting circuit C is first to be immersed into the conductive water. The sensor electrode pads P10, P11 in the water immersion detecting circuit C are electrically connected and leakage current I flows so as to turn on the transistor Q20. The terminals a, b in the opening-operation control circuit Eo and the closing-operation control circuit Es are then connected to the ground 62 through the diodes D10, D20, thereby turning on the final output stage transistors To, Ts simultaneously. As a result, both of the circuits in the opening relay Ro and the shutting relay Rs are made, leading to increased electric potential at both ends of the motor 69. In this arrangement, unintentional opening or shutting movement of the automotive window is eliminated since the motor 69 does not actuate due to increased electric potential at both ends of the motor 69.

It is to be understood that changes and variations may be made without departing from the spirit or scope of the invention.

What is claimed is:

1. A water immersion detecting circuit, comprising:
   electronic circuitry provided on a printed board of an electronic unit and used for detecting water immersion of the electronic unit based on a change of resistance generated between a pair of sensor electrodes for detecting water immersion, wherein the pair of sensor electrodes are positioned adjacent to each other on the printed board, and an opening is formed in the printed board between the sensor electrodes such that an imaginary line extending between the pair of sensor electrodes passes through a space in said printed board defining said opening.

2. A water immersion detecting circuit according to claim 1, wherein said opening is a U-shaped gap defined by a peripheral edge of said printed board.

3. A water immersion detecting circuit according to claim 1, wherein said opening is a V-shaped gap defined by a peripheral edge of said printed board.

4. A water immersion detecting circuit according to claim 1, wherein said opening is a hole passing through said printed board.

5. A water immersion detecting circuit, comprising:
   electronic circuitry provided on a printed board of an electronic unit and used for detecting water immersion of the electronic unit based on a change of resistance generated between a pair of sensor electrodes for detecting water immersion, wherein the sensor electrodes are positioned on front and reverse sides of the printed board respectively such that said sensor electrodes are separated by said printed board.

6. A water immersion detecting circuit, comprising
   electronic circuitry provided on a printed board of an electronic unit and used for detecting water immersion of the electronic unit, wherein a single sensor electrode for detecting water immersion is provided on the printed board of the electronic unit, and water immersion of the electronic unit is detected based on a change of resistance between the sensor electrode and a grounding point of the electronic unit, said grounding point being remote from said printed board.

* * * * *